US007675968B2

United States Patent
Takatori et al.

(10) Patent No.: US 7,675,968 B2
(45) Date of Patent: Mar. 9, 2010

(54) ADAPTIVE FIR FILTER AND METHOD

(76) Inventors: Hiroshi Takatori, 932 S. Beach Dr., Sacramento, CA (US) 95831; Chien-Hsin Lee, 1269 Freswick Dr., Folsom, CA (US) 95630

( * ) Notice: Subject to any disclaimer, the term of this patent is extended or adjusted under 35 U.S.C. 154(b) by 1308 days.

(21) Appl. No.: 10/954,137

(22) Filed: Sep. 28, 2004

(65) Prior Publication Data

US 2005/0094723 A1 May 5, 2005

Related U.S. Application Data

(60) Provisional application No. 60/507,386, filed on Sep. 29, 2003.

(51) Int. Cl.
*H03H 7/30* (2006.01)
(52) U.S. Cl. ........................................ 375/232
(58) Field of Classification Search .................. 375/229, 375/230, 232
See application file for complete search history.

(56) References Cited

U.S. PATENT DOCUMENTS

| 5,572,552 | A  | * | 11/1996 | Dent et al. ............... 375/343 |
|-----------|----|---|---------|-------------------------------------|
| 6,426,972 | B1 | * | 7/2002  | Endres et al. ............ 375/229   |
| 6,744,886 | B1 |   | 6/2004  | Benesty et al. ......... 379/406.08  |
| 6,775,322 | B1 |   | 8/2004  | Zangi et al. ............. 375/232   |
| 6,792,040 | B1 | * | 9/2004  | Davis et al. ............. 375/222   |
| 7,321,620 | B2 | * | 1/2008  | Nakahira et al. ........ 375/232     |
| 2001/0004392 | A1 | | 6/2001 | Stek et al. .............. 375/350   |
| 2003/0035474 | A1 | * | 2/2003 | Gorecki et al. .......... 375/229   |
| 2003/0157914 | A1 | * | 8/2003 | Li et al. ................... 455/296 |

* cited by examiner

*Primary Examiner*—Kevin M Burd
(74) *Attorney, Agent, or Firm*—Dorsey & Whitney LLP

(57) ABSTRACT

Finite impulse response filters are commonly used in high speed data communications electronics for reducing error rates in multilevel symbol encoding schemes. Schemes such as pulse amplitude modulation and quadrature amplitude modulation may have higher error rates for symbols with low signal to noise ratios. By selectively updating the tap coefficients of the filter based on the symbols received, a more robust, accurate filter can be built.

15 Claims, 7 Drawing Sheets

$$h(i+1) = h(i) + (\mu * sign(data) * sign(error))$$

Up/Down Pulse

Integrator output

Fig. 4
(prior art)

| Data | +3 | | +1 | | -1 | | -3 | |
|---|---|---|---|---|---|---|---|---|
| Sgn Error | + | - | + | - | + | - | + | - |
| Up/ Down Pulse | Up | Down | Up | Down | Down | Up | Down | Up |

(where up = +1, down = -1)

Fig. 6

| Data | +3 | | +1 | | -1 | | -3 | |
|---|---|---|---|---|---|---|---|---|
| Sgn Error | + | - | + | - | + | - | + | - |
| Up/ Down | Up | Down | None | None | None | None | Down | Up |

(where up = +1, down = -1, none = 0)

ADAPTIVE FIR FILTER AND METHOD

RELATED APPLICATIONS

This application claims priority under 35 U.S.C. §119(e) to provisional application No. 60/507,386 filed on Sep. 29, 2003 titled "FIR Adaption Method."

FIELD

The invention relates to finite impulse response filters, and, more specifically, adaptive finite impulse response filters.

BACKGROUND

Finite impulse response (FIR) filters are commonly used in high speed data communications electronics for reducing error rates in multilevel symbol encoding schemes. Schemes such as pulse amplitude modulation (PAM) and quadrature amplitude modulation (QAM) may have higher error rates for symbols with low signal to noise ratios. A symbol refers to a data pulse on a line. The symbol may have several bits of information encoded within the voltage level and polarity (PAN for example). By using high levels of bit encoding in symbols, lower symbol rates can be used. Lower symbol rates are desirable because of their lower levels of noise.

FIG. 1 shows an example of a symbol pulse. The symbol pulse 102 shows the analog voltage vs. time response of the symbol being driven on the line. In an ideal world, the symbol pulse 102 would look like a square wave. Unfortunately, real pulses have profiles like that shown in FIG. 1. The line is driven so that at time t0 the amplitude of the pulse 102 is about h0. As the pulse 102 is driven back to zero, it still has an amplitude of h1 at time t1. The spacing of times t0 and t1 corresponds with the symbol rate. Thus, the receiver might confuse the pulse 102 amplitude at time t1 with a symbol meant to be valid at time t1, when it was simply the tail end of the pulse 102 meant to be valid at time t0.

FIG. 2 shows an example of two successive four level PAM symbols. Four level PAM usually has an encoding scheme with four different voltage levels: +3, +1, −1, and −3 volts. This scheme gives two bits of encoding. Two successive symbols are shown with their possible waveforms for each pulse, one intended to be valid at time t0 and one at t1. The first symbol has possible pulses peaking at time t0 and has the following possibilities: a +3 pulse 202, a +1 pulse 204, a −1 pulse 206, or a −3 pulse 208. Similarly, the second symbol has possible pulses peaking at time t1 and has the following possibilities: a +3 pulse 210, a +1 pulse 212, a −1 pulse 214, or a −3 pulse 216. One can see that a +3 pulse 202 looks like +3 volts at time t0 and +1 volt at time t1.

FIG. 3 shows an example of a one tap FIR filter. The filter 302 provides a method of determining how much of first symbols tail needs to be removed from the apparent head of a second symbol. Data 303, which may be digital decoded, passes through a delay block 304. The delay block 304 delays the propagation of the data 303 for one period corresponding to the symbol rate. The data 303 then goes into the pulse block 306, where the sign of the data 303 is determined. It is also possible to determine the sign of the data 303 before the pulse block 306 and simply feed the sign of the data to the pulse block 306. The pulse block 306 also receives the sign of the error 308, which is determined by the difference between a symbol pulse and its decoded data at a given clock edge.

The output of a prior art pulse block 306 is the sign of the data 303 multiplied by the sign of the error 308. This output in the up/down pulse, and it is fed into an integrator 310. The integrator multiplies the up/down pulse by a small constant $\mu$ and adds that value to the previous filter coefficient to create a new coefficient. The following equation summarizes this:

$$h_{i+1} = h_i + (\mu * \mathrm{sign}(\mathrm{data}) * \mathrm{sign}(\mathrm{error}))$$

Thus, the coefficient of the filter 302 constantly changes based on the sign of the error 308 and the sign of the data 303. The coefficient output of the integrator 310 is multiplied by the delayed data 303 at a multiplier 312. The result is a correction signal 314 that, when added to the symbol signal, ideally cancels any signal portions of previous symbols from a current symbol before the current symbol is decoded. Actual filters 302 may employ more than one tap in order to achieve the desired results.

FIG. 4 shows a chart of a prior art up/down pulse determination scheme. The sign of the data multiplied by the sign of the error determines the sign of the up/down pulse. Unfortunately, this prior art scheme does not work very well for noisy systems and symbols with small signals.

FIG. 5 shows an example of amplitude error and noise for symbols. The symbols 3, 1, −1, and −3 508, 506, 504, 502 respectively each have error distributions in their amplitudes. Also shown is a noise 510 distribution. For symbols with low signal to noise ratios, like symbol 1 506 and symbol −1 504, the noise 510 in the system may disrupt the accuracy of the up/down pulse. This, in turn, may erroneously affect the modification of filter coefficients.

Thus, there is a need for a FIR filter that accounts for low signal to noise ratio symbols when updating filter coefficients.

SUMMARY

This document describes a FIR filter where filter coefficients are selectively updated. This document also describes a method for selectively updating filter coefficients.

BRIEF DESCRIPTION OF DRAWINGS

FIG. 4 shows a chart of a prior art up/down pulse determination scheme.

FIG. 6 shows a chart of an up/down pulse determination scheme according to an embodiment of the invention.

DESCRIPTION

FIR filters are used in many types of circuits. Examples include decision-feedback equalizers (DFE), echo cancellers (EC), feed forward equalizers (FFE), automatic gain control (AGC), and adaptive reference control (ARC). By not updating the filter coefficients for symbols with low signal to noise ratios, a more robust, less noise sensitive filter can be created.

FIG. 6 shows an example of a selective up/down pulse scheme for four level PAM. With four level PAM, the +3, −3 symbols have high signal to noise ratios, while the +1, −1 symbols have low signal to noise ratios. By changing the possible output of a pulse block (from −1, 1 in the prior art) to −1, 0, 1, the filter is allowed to keep its coefficients constant for symbols with low signal to noise ratios. The scheme shown in FIG. 6 outputs the sign(data)*sign(error) for symbols of +3 and −3, but the scheme also has an output of zero for symbols of +1 and −1. An output of zero means that an integrator will keep a tap coefficient constant for that symbol. The implementation of the modified up/down pulse scheme may be, among others, a lookup table or simple logical circuit. The implementation looks at both the sign and magnitude of the symbol.

The method of selectively updating filter coefficients may be applied to any encoding scheme. For example, with eight level PAM, one may choose to only update the coefficients for symbols with the largest absolute values (for example, +7 and −7, where the symbols are −7, −5, −3, −1, 1, 3, 5, 7). In another example, with 12 level PAM, one may choose to only update the coefficients for symbols with the largest absolute values (for example, +11 and −11, where the symbols are −11, −9, −7, −5, −3, −1, 1, 3, 5, 7, 9, 11). Alternately, one may choose to update the coefficients only for symbols with absolute signals in the upper half of possibilities. Alternately, one may choose to update the coefficients for all symbols except those with the smallest absolute signals (for example, update for all but 1 and −1 in 12-PAM). The scheme may also be used for quadrature encoded symbols. The symbols with low signal to noise ratios simply do not trigger an update of the filter coefficients.

Figure 1:
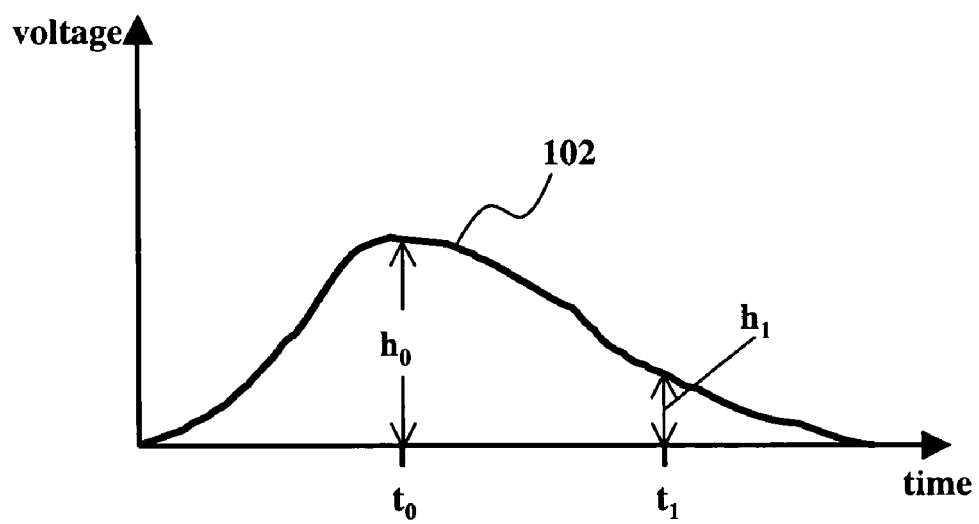
FIG. 1 shows an example of a prior art symbol pulse.
Figure 2:
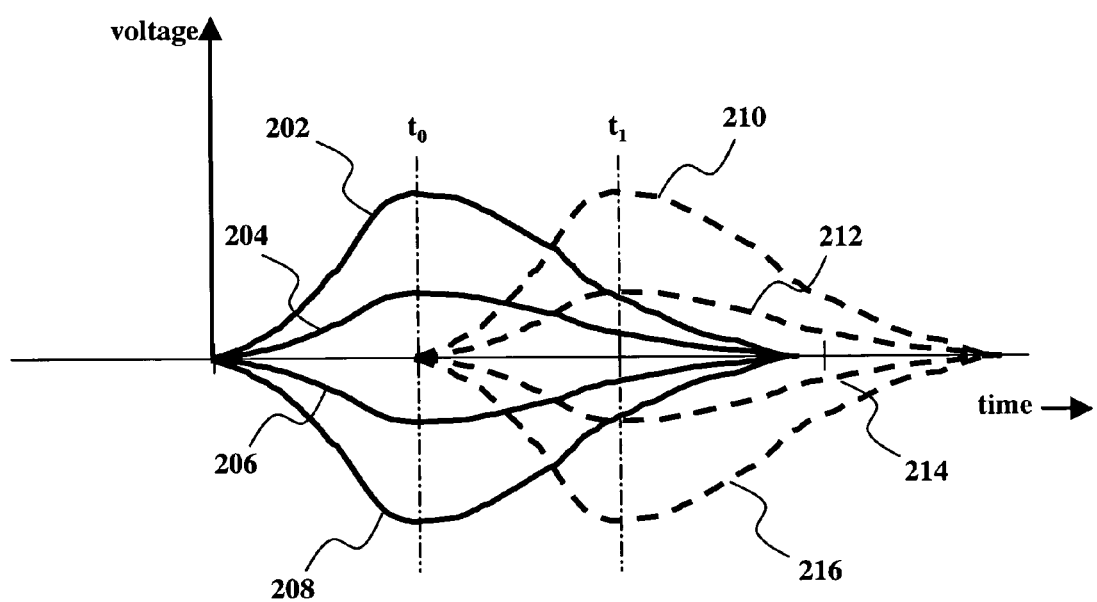
FIG. 2 shows an example of two successive prior art four level PAM symbols.
Figure 3:
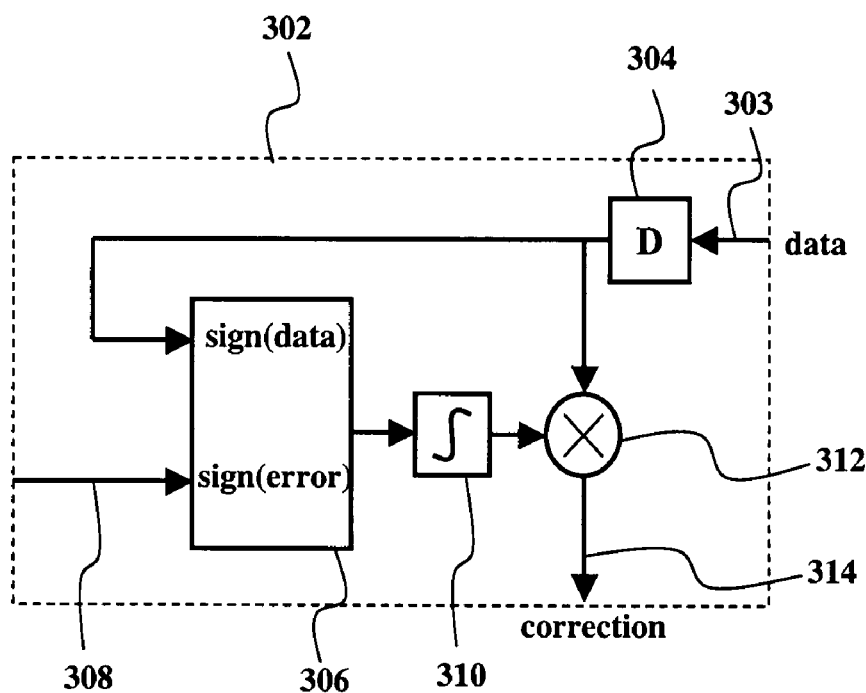
FIG. 3 shows an example of a prior art one tap FIR filter.
Figure 5:
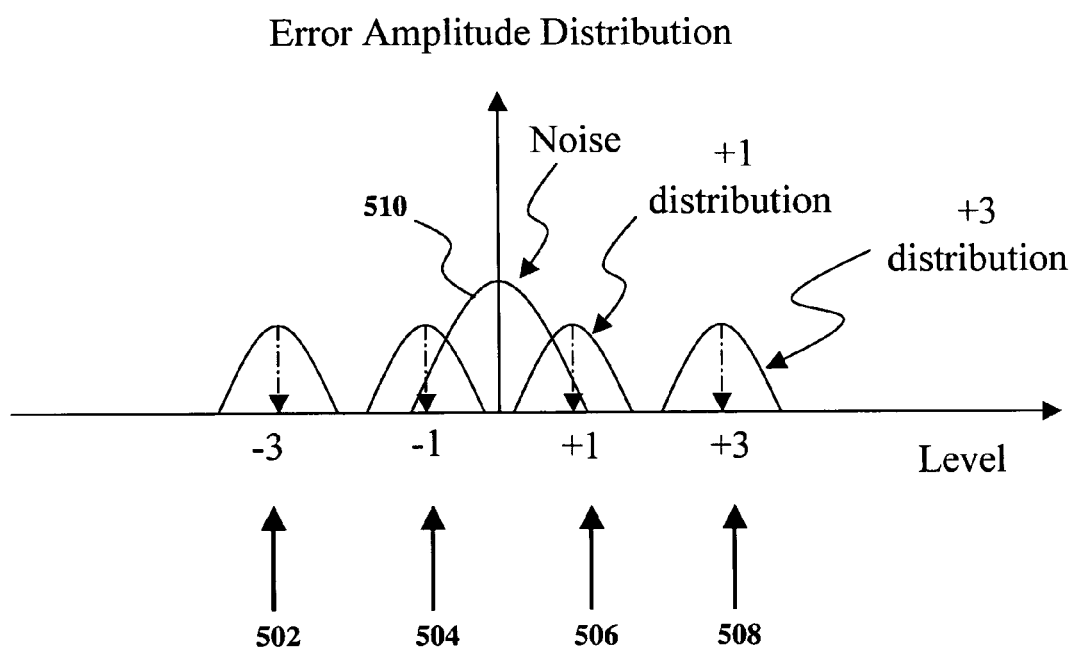
FIG. 5 shows an example of prior art amplitude error and noise for symbols.
Figure 7:
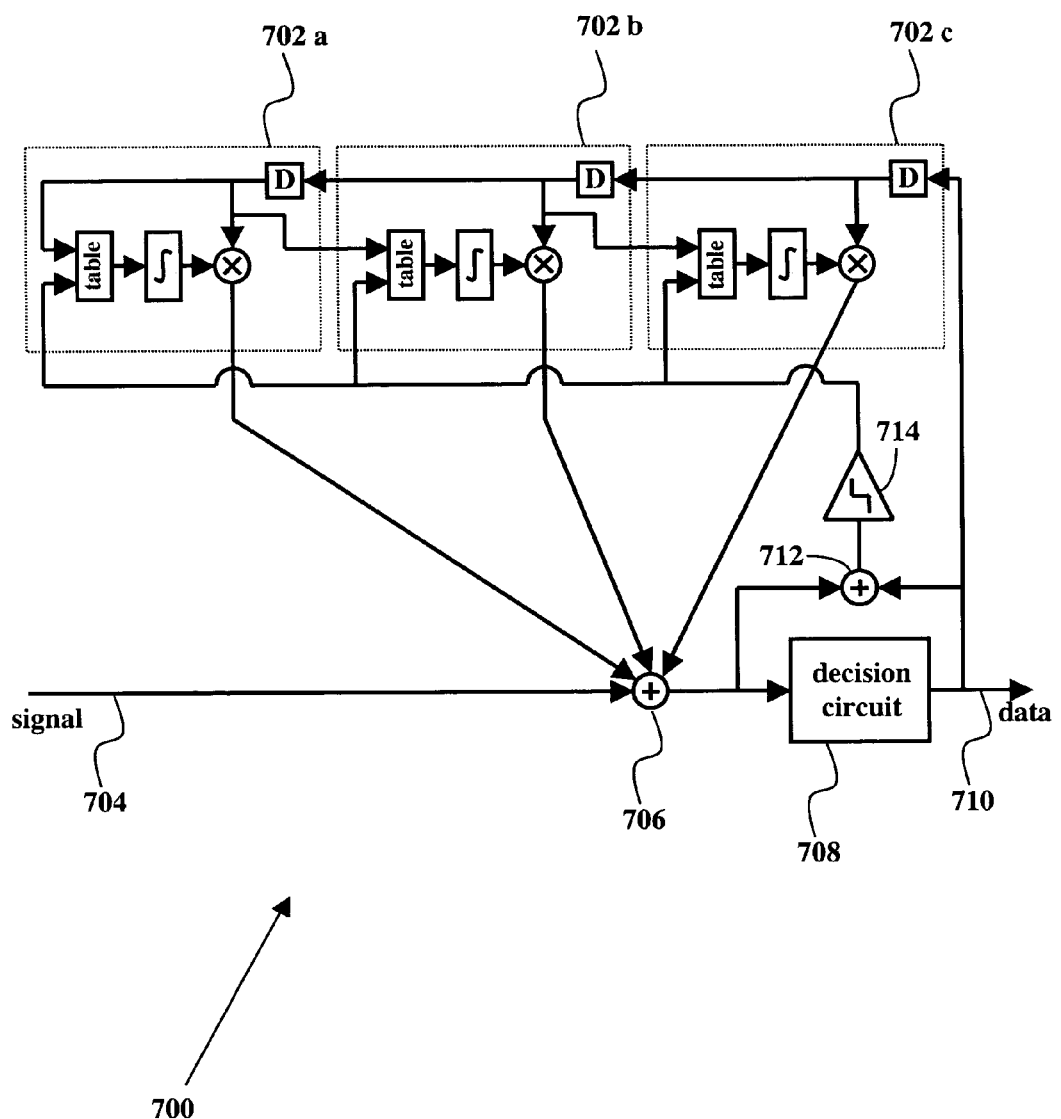
FIG. 7 shows an example of a three tap DFE filter according to an embodiment of the invention.

FIG. 7 shows an example of a three tap DFE filter. The DFE filter 700 includes three taps 702a, 702b, 702c. The taps 702a, 702b, 702c each comprise a FIR filter with a selective coefficient updating scheme. The output of the taps is added to an incoming signal 704 at a summing node 706. The output of the summing node 706 ideally has a level corresponding to the current symbol. The decision circuit 708 decodes the signal into data 710. The difference between the data 710 and the symbol is determined at a subtracting node 712. This difference comprises the error. Feeding the error through a slicer 714 results in the sign of the error, which is fed to each tap 702a, 702b, 702c of the filter 700. The table blocks noted in each tap 702a, 702b, 702c comprise the up/down pulse blocks that select an up, down, or zero pulse for the integrator. The table blocks may be lookup tables, logic, or even an adaptive algorithm that determines for which symbols the coefficients will be updated. The schemes used in each tap may not necessarily be the same.

It will be apparent to one skilled in the art that the described embodiments may be altered in many ways without departing from the spirit and scope of the invention. Accordingly, the scope of the invention should be determined by the following claims and their equivalents.

What is claimed is:

1. A finite impulse response filter comprising:
   a block configured to generate a coefficient adjustment signal based, at least in part, on a voltage level of a received symbol in a pulse amplitude-modulated signal;
   an integrator configured to generate an undated filter coefficient based, at least in part, on a tap coefficient associated with the finite impulse response filter and the coefficient adjustment signal; and
   a multiplier coupled to the integrator and configured to multiply the received symbol with the updated filter coefficient to generate a correction signal;
   wherein the block is further configured to generate the coefficient adjustment signal with a value such that the updated filter coefficient is equal to the tap coefficient in response to receipt of a symbol having a first specific voltage level and to generate the coefficient adjustment signal with a value such that the updated filter coefficient is different from the tap coefficient in response to receipt of a symbol having a second specific voltage level.

2. The finite impulse response filter of claim 1, wherein the block comprises a lookup table configured to store an association between the received symbol and a value used to generate the updated filter coefficient.

3. The finite impulse response filter of claim 1, wherein the pulse amplitude-modulated signal comprises an eight-level pulse amplitude-modulated signal, and wherein the block is further configured to generate the coefficient adjustment signal with a value such that the updated filter coefficient is equal to the tap coefficient in response to receipt of a symbol having an amplitude of +7 or −7 and to generate the coefficient adjustment signal with a value such that the updated filter coefficient is different from the tap coefficient in response to receipt of a symbol having an amplitude other than 7 and −7.

4. The finite impulse response filter of claim 1, wherein the block is further configured to generate the coefficient adjustment signal based on a signal-to-noise ratio of the received symbol.

5. The finite impulse response filter of claim 1, wherein the block is further configured to receive a first signal corresponding to a sign of the received symbol and a second signal corresponding to a sign of an error signal corresponding to a difference between the received symbol and a corresponding decoded data signal, and wherein the block is further configured to generate the coefficient adjustment signal based, at least in part, on a multiplication of the first and second signals in response to receipt of a symbol having the second specific voltage level and to generate the coefficient update signal equal to a constant tap coefficient in response to receipt of a symbol having the first specific voltage level.

6. The finite impulse response filter of claim 5, wherein the block comprises a lookup table configured to store an association between the voltage level of the received symbol, the sign of the received symbol, and the coefficient adjustment signal.

7. The finite impulse response filter of claim 5, wherein the block comprises a logic circuit.

8. A method of adjusting a tap coefficient for a finite impulse response filter, the method comprising:
   in response to receipt of a pulse amplitude-modulated signal including a first data symbol having a first specific voltage level, adjusting the filter coefficient based on a sign of the received first data symbol and a sign of an error signal corresponding to a difference between the received first data symbol and a decoded data signal; and
   maintaining a constant tap coefficient in response to receipt of a second data symbol having a second specific voltage level.

9. The method of claim 8, wherein the second specific voltage level is less than the first specific voltage level.

10. The method of claim 8, wherein the first data symbol has a higher signal-to-noise ratio than the second data symbol.

11. The method of claim 8, further comprising accessing a lookup table storing an association between the voltage level of the received data symbol, the sign of the received data symbol, and the coefficient adjustment signal.

12. The method of claim 8, wherein said adjusting the filter coefficient comprises generating a filter coefficient adjustment signal based, at least in part, on multiplying the sign of the received data symbol and the sign of the error signal.

13. The method of claim 8, wherein said maintaining a constant tap coefficient comprises generating a filter coefficient adjustment signal corresponding to the constant tap coefficient.

14. A decision feedback equalizer comprising:

a decision circuit configured to receive a data signal and output decoded data;

an error calculator configured to generate an error signal corresponding to a difference between the data signal and the decoded data;

a plurality of taps coupled in series, wherein the plurality of taps are configured to receive a data signal, delay the data signal, and couple the delayed data signal to a next tap, each tap comprising a finite impulse response filter having a corresponding filter coefficient, wherein each finite impulse response filter is configured to generate a correction signal based on the data signal and the filter coefficient, and wherein each finite impulse response filter includes a filter coefficient updater configured to update the filter coefficient based, at least in part, on a specific voltage level of a received symbol; and a summer configured to receive the respective correction signals from the plurality of taps, wherein the summer is coupled to the decision circuit and configured to receive an input signal and to generate the data signal based, at least in part, on the correction signals.

15. A finite impulse response filter having an associated filter coefficient, the finite impulse response filter comprising:

means for delaying an input signal;

means for updating the filter coefficient based on the filter coefficient and a symbol of the delayed input signal, wherein the filter coefficient is updated to a different filter coefficient in response to receipt of a first symbol having a first specific voltage level, and wherein the filter coefficient is maintained constant in response to receipt of a second symbol having a second specific voltage level; and means for generating a correction signal based on the delayed input signal and the updated filter coefficient.

\* \* \* \* \*